(12) United States Patent
Kim

(10) Patent No.: US 9,881,672 B2
(45) Date of Patent: Jan. 30, 2018

(54) RESISTIVE MEMORY APPARATUS AND VOLTAGE GENERATING CIRCUIT THEREFOR

(71) Applicant: SK hynix Inc., Icheon-si Gyeonggi-do (KR)

(72) Inventor: Tae Ho Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/236,593

(22) Filed: Aug. 15, 2016

(65) Prior Publication Data

US 2017/0243641 A1 Aug. 24, 2017

(30) Foreign Application Priority Data

Feb. 18, 2016 (KR) .................... 10-2016-0019050

(51) Int. Cl.
*G11C 11/00* (2006.01)
*G11C 13/00* (2006.01)

(52) U.S. Cl.
CPC ........ *G11C 13/004* (2013.01); *G11C 13/0061* (2013.01)

(58) Field of Classification Search
CPC .............. G11C 13/004; G11C 13/0069; G11C 13/0007; G11C 11/1673; G11C 13/0002; G11C 13/0004; G11C 13/003; G11C 11/161; G11C 11/1675; G11C 13/0026; G11C 13/0038; G11C 11/5642; G11C 13/0028

See application file for complete search history.

(56) References Cited

U.S. PATENT DOCUMENTS

| | | | |
|---|---|---|---|
| 2014/0063904 A1* | 3/2014 | Yon ....................... | G11C 13/004 365/148 |
| 2015/0162382 A1* | 6/2015 | Sekar ................. | G11C 13/0069 365/148 |

FOREIGN PATENT DOCUMENTS

KR 1020080097310 A 11/2008
KR 1020140080942 A 7/2014

\* cited by examiner

*Primary Examiner* — Uyen B Tran
(74) *Attorney, Agent, or Firm* — William Park & Associates Ltd.

(57) ABSTRACT

A resistive memory apparatus may include a memory region including a plurality of resistive memory cells arranged in a plurality of memory cell pairs. The resistive memory apparatus may include a voltage generating circuit configured to generate a read voltage code based on a switching state of at least one memory cell pair. The resistive memory apparatus may include a voltage providing unit configured to generate a read voltage corresponding to the read voltage code.

20 Claims, 9 Drawing Sheets

RESISTIVE MEMORY APPARATUS AND VOLTAGE GENERATING CIRCUIT THEREFOR

CROSS-REFERENCES TO RELATED APPLICATION

This application claims priority under 35 U.S.C. 119(a) to Korean application No. 10-2016-0019050, filed on Feb. 18, 2016, in the Korean intellectual property Office, which is incorporated by reference in its entirety as set forth in full.

BACKGROUND

1. Technical Field

Various embodiments may generally relate to a semiconductor integrated circuit device, and more particularly, to a resistive memory apparatus and a voltage generating circuit therefor.

2. Related Art

Resistive memory apparatuses have attracted attention next-generation memory apparatuses in which advantages of memory apparatuses such as low cost, random access, high-speed operation, low power consumption, a nonvolatile characteristic, and the like are merged.

The resistive memory apparatuses may be memory apparatuses in which a data storage material layer is arranged between a pair of electrodes. Data is stored within in the resistive memory apparatus through change in a resistance state of the data storage material layer according to an applied current or voltage.

Phase-change random access memory (PRAMs) as one of the resistive memory apparatuses may include an access element and a data storage material layer configured of a phase-change material as a basic configuration. When a preset voltage is applied between a word line and a bit line to write (program) data in the PRAM, a write current may be applied to the data storage material layer and the resistance state of the data storage material layer may be changed to a crystalline state (low resistance state) or an amorphous state (high resistance state).

In the data storage material constituting the resistive memory apparatus, the disturbance that the resistance state of the data storage material is changed according to neighboring environments such as temperature, heat generated in a write operation, and an elapsed time after the write may be expressed.

Therefore, there is a need for a method for accurately reading data stored in the resistive memory apparatus.

SUMMARY

According to an embodiment, there may be provided a resistive memory apparatus. The resistive memory apparatus may include a memory region including a plurality of resistive memory cells arranged in a plurality of memory cell pairs. The resistive memory apparatus may include a voltage generating circuit configured to generate a read voltage code based on a switching state of at least one memory cell pair. The resistive memory apparatus may include a voltage providing unit configured to generate a read voltage corresponding to the read voltage code.

According to an embodiment, there is provided a voltage generating circuit. The voltage generating circuit may include a voltage determination unit configured to generate a read voltage code based on switching states of at least a pair of memory cells which share a first signal line. The voltage generating circuit may include a path setup unit configured to apply a read voltage corresponding to the read voltage code to second signal lines of the at least a pair of memory cells.

DETAILED DESCRIPTION

Figure 1:
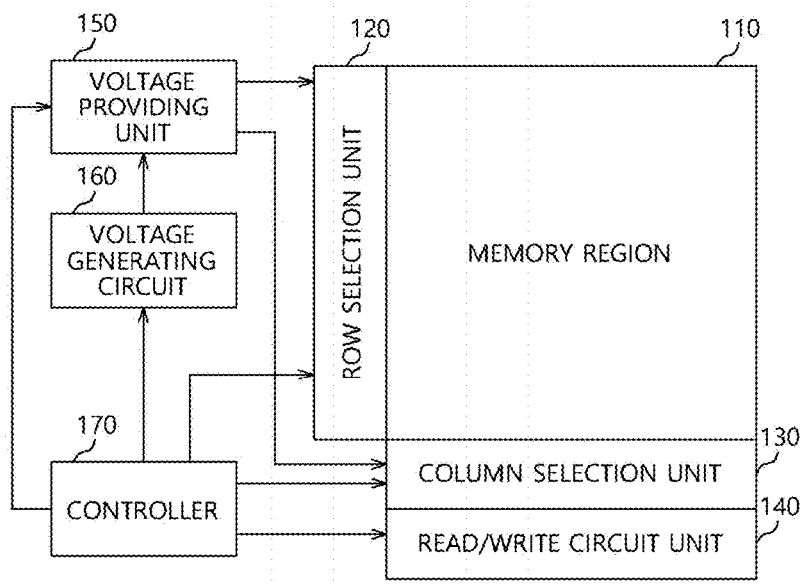
FIG. 1 is a configuration diagram illustrating a representation of an example a resistive memory apparatus according to an embodiment.

Examples of embodiments will be described below with reference to the accompanying drawings. Examples of embodiments are described herein with reference to cross-sectional illustrations that are schematic illustrations of the examples of embodiments (and intermediate structures). As such, variations from the shapes of the illustrations as a result, for example, of manufacturing techniques and/or tolerances, are to be expected. Thus, embodiments should not be construed as limited to the particular shapes illustrated herein but may include deviations in shapes that result, for example, from manufacturing. In the drawings, lengths and sizes of layers and regions may be exaggerated for clarity. Like reference numerals in the drawings denote like elements. It is also to be understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form, and vice versa as long as it is not specifically mentioned.

The concepts are described herein with reference to cross-section and/or plan illustrations of idealized embodiments. However, the embodiments should not be construed as limiting. Although a few embodiments will be illustrated and described, it will be appreciated by those of ordinary skill in the art that changes may be made in these examples of the embodiments without departing from the principles and spirit of the disclosure.

FIG. 1 is a configuration diagram illustrating a representation of an example a resistive memory apparatus according to an embodiment.

Referring to FIG. 1, a resistive memory apparatus 10 according to an embodiment may include a memory region 110, a row selection unit 120, a column selection unit 130, a read/write circuit unit 140, and a voltage providing unit 150, a voltage generating circuit 160, and a controller 170.

The memory region 110 may be configured of resistive memory cells coupled between word lines and bit lines and arranged in an array form. In an embodiment, the memory region 110 may have a stacking array structure that at least two or more array layers are stacked. In an embodiment, the memory region 110 may have a cross point array structure in which a pair of memory cells are formed in a vertical direction with respect to a plane of a semiconductor substrate so that the pair of memory cells share a preset first signal line and are coupled between a pair of second signal lines in serial.

In an embodiment, the memory region 110 may include a plurality of memory cell pairs and may have a structure that each of the memory cell pairs shares a bit line and is coupled between a lower word line and an upper word line in series.

The resistive memory cell may be configured of any one among various types of memory cells, such as a phase-change random access memory (PRAM) cell using a chalcogenide alloy, a magnetic random access memory (MRAM) cell using a tunneling magneto-resistive (TMR) layer, a resistive random access memory (RERAM) cell using a transition metal oxide, a polymer RAM cell, a RAM cell using perovskite, and a ferroelectric random access memory (FRAM) cell using a ferroelectric capacitor, but the resistive memory cell is not limited thereto. The resistive memory cell may be a single level cell (SLC) which stores 1-bit data in one memory cell or a multi-level cell (MLC) which stores 2-bit or more data in one memory cell.

The row selection unit 120 and the column selection unit 130 may be address decoders and may be configured to receive address signals. The row selection unit 120 and the column selection unit 130 may decode a row address and a column address of a memory cell to be accessed in the memory region 110, that is, a word line address and a bit line address of the memory cell to be accessed through control of the controller 170.

The read/write circuit unit 140 may be configured to write data in the memory region 110 by receiving the data from a data input/output (I/O) circuit block (not illustrated) through control of the controller 170 or provide data read out from a selected memory cell of the memory region 110 to the data I/O circuit block through control of the controller 170.

The voltage providing unit 150 may be configured to generate an operation voltage such as a write voltage for a data program operation, a read voltage for verification, and a read voltage for a data read operation and provide the generated operation voltage to the row selection unit 120, the column selection unit 120, and the like through control of the controller 170. For example, the voltage providing unit 150 may be configured to provide the read voltage based on a read voltage code provided from the voltage generating circuit 160 in a read operation.

The voltage generating circuit 160 may be configured to determine the read voltage based on switching states of at least a pair of memory cells which share the first signal line (for example, the bit line) and are coupled between a second lower signal line and a second upper signal line in series in a read voltage determination mode. In an embodiment, the voltage generating circuit 160 may generate the determined read voltage in a digital code (read voltage code) and provide the read voltage code to the voltage providing unit 150.

The at least a pair of memory cells which are used to determine the read voltage may be selected among the plurality of memory cells provided in the memory region 110, and the at least a pair of memory cells may refer to a reference cell in the read voltage determination mode.

The at least a pair of reference cells may store complementary data. At least one memory cell or both memory cells in the pair of memory cells constituting the reference cell may be switched to form a current path according to a voltage level applied to the at least a pair of reference cells from the voltage generating circuit 160 through the voltage providing unit 150 in the read voltage determination mode. In an embodiment, the voltage generation circuit 160 may be configured to apply the read voltage to any one of the pair of second signal lines in the read voltage determination mode, and generate a final voltage code from the read voltage at a timing that a current path is formed through the at least one memory cell pair.

For example, any one of the pair of reference cells may have been programed in a low resistance state (a set state), and the other reference cell may have been programmed in a high resistance state (a reset state). A switching voltage $Vth\_set$ of the reference cell programmed in the low resistance state may have a lower level than a switching voltage $Vth\_reset$ of the reference cell programmed in the high resistance state. Since the pair of reference cells are coupled in series, a voltage corresponding to the sum $(Vth\_set+Vth\_reset)$ of the switching voltages has to be applied between the second upper signal line and the second lower signal line to switch both the pair of reference cells. Accordingly, it can be seen that a reference voltage having a level of $(Vth\_set+Vth\_reset)/2$ has to be applied to determine a level of data programmed in each of the pair of reference cells.

Accordingly, the voltage generating circuit 160 according to an embodiment may apply the read voltage through any one of the second signal lines, for example, the second upper signal line in the read voltage determination mode and detect the read voltage when the pair of reference cells are switched. The voltage generating circuit 160 may determine the voltage having a level corresponding to ½ a level of the detected read voltage as the read voltage, and generate the read voltage code based on the read voltage.

The voltage generating circuit 160 may apply the read voltage to the pair of reference cells by gradually increasing (or reducing) the read voltage from an initial read voltage. An operation of the voltage generating circuit 160 will be described later with reference to FIG. 4.

The controller 170 may control the row selection unit 120, the column selection unit 130, and the read/write circuit unit 140 to write data in the memory region 110 in response to a write command input from an external apparatus or a host. The controller 170 may control the row selection unit 120, the column selection unit 130, and the read/write circuit unit 140 to read data from the memory region 110 in response to a read command input from the external apparatus or the host.

Figure 2:
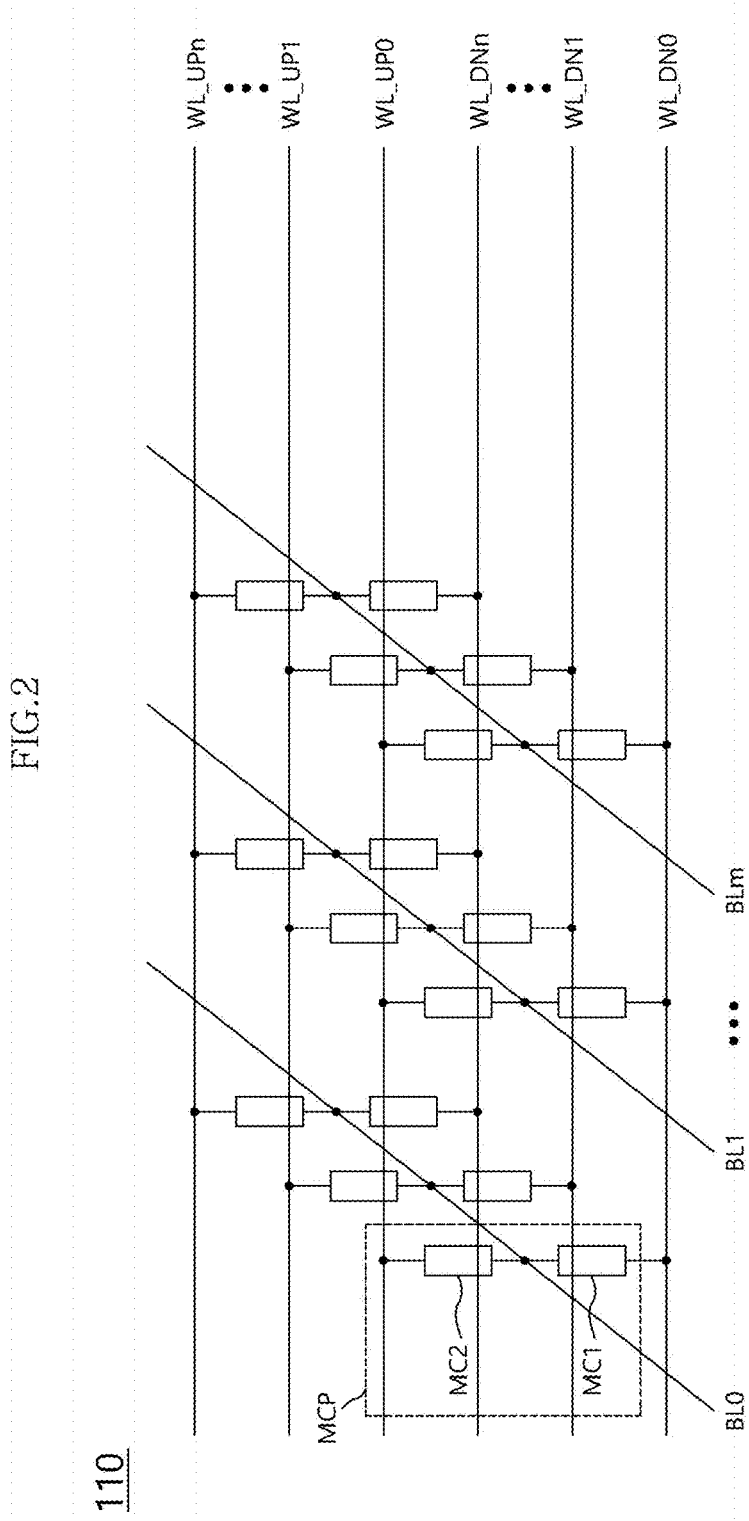
FIG. 2 is a configuration diagram illustrating a representation of an example a memory region according to an embodiment.

As described above, the memory cells constituting the memory region 110 may have a stacking structure or a three-dimensional (3D) array structure called a cross point array structure, and an example of the memory cell array structure is illustrated in FIG. 2.

FIG. 2 is a configuration diagram illustrating a representation of an example a memory region according to an embodiment.

Referring to FIG. 2, the memory region 110 may include a plurality of bit lines BL0 to BLm as the first signal line, a plurality of lower word lines WL_DN0 to WL_DNn as the second lower signal line, a plurality of upper word lines WL_UP0 to WL_UPn as the second upper signal line, and a plurality of memory cell pairs MCP. The second lower signal line and the second upper signal line sharing the first signal line with the second lower signal line may refer to the second signal line.

The plurality of bit lines BL0 to BLm may be formed to be spaced from each other substantially in parallel with a plane of a semiconductor substrate (not illustrated).

The plurality of lower word lines WL_DN0 to WL_DNn may be formed to cross the plurality of bit lines BL0 to BLm below the plurality of bit lines BL0 to BLm in a vertical direction.

The plurality of upper word lines WL_UP0 to WL_UPn may be formed to cross the plurality of bit lines BL0 to BLm over the plurality of bit lines BL0 to BLm in the vertical direction.

Each of the plurality of memory cell pairs MCP may include a pair of memory cells MC1 and MC2 which share corresponding one of the bit lines BL0 to BLm, are coupled between corresponding one of the upper word lines WL_UP0 to WL_UPn and corresponding one of the lower word lines WL_DN0 to WL_DNn, and are stacked in a vertical direction with respect to the plane of the semiconductor substrate. Each of the memory cells MC1 and MC2 may be a resistive memory cell.

One end of a first memory cell MC1 may be coupled to the corresponding one among the bit lines BL0 to BLm and the other end of the first memory cell MC1 may be coupled to the corresponding one among the lower word lines WL_DN0 to WL_DNn. One end of a second memory cell MC2 may be coupled to the corresponding one among the bit lines BL0 to BLm and the other end of the second memory cell MC2 may be coupled to the corresponding one among the upper word lines WL_UP0 to WL_UPn.

That is, the pair of memory cells MC1 and MC2 may share the bit line BLy and are coupled between the upper word line WL_UPx and the lower word line WL_DNx in series.

Figure 3:
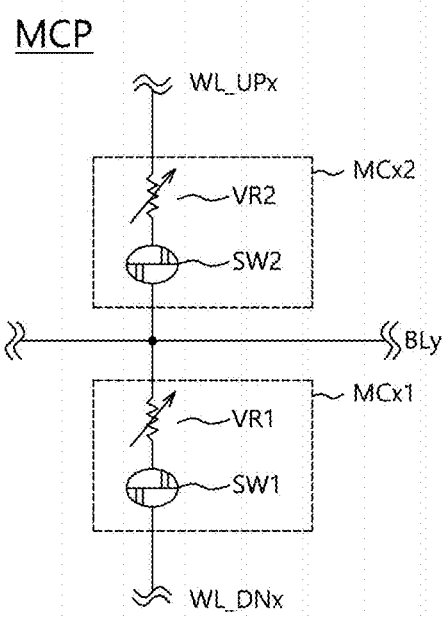
FIG. 3 is a configuration diagram illustrating a representation of an example a resistive memory cell according to an embodiment.

FIG. 3 is a configuration diagram illustrating a representation of an example of a resistive memory cell according to an embodiment.

Referring to FIG. 3, a memory cell pair MCP may include a first memory cell MCx1 coupled between the lower word line WL_DNx and the bit line BLy and a second memory cell MCx2 coupled between the upper word line WL_UPx and the bit line BLy.

The first memory cell MCx1 may have a structure that a data storage node VR1 having a variable resistance characteristic and a switching element SW1 are coupled in series and the second memory cell MCx2 may have a structure that a data storage node VR2 having a variable resistance characteristic and a switching element SW2 are coupled in series.

The switching elements SW1 and SW2 may be an ovonic threshold switch (OTS), but the switching elements are not limited thereto. The ovonic threshold switch may be an element that switching is accomplished in a preset threshold voltage.

In the resistive memory apparatus having the memory region 110 illustrated in FIGS. 2 and 3, a sense amplifier may be coupled to each of the lower word line WL_DNx and the upper word line WL_UPx. The resistive memory apparatus may be configured to read out a logic level of data in a selected memory cell according to a switching state of the selected memory cell when any one of the lower word line WL_DNx and the upper word line WL_UPx is selected and the read voltage is applied to the bit line BLy.

Figure 4:
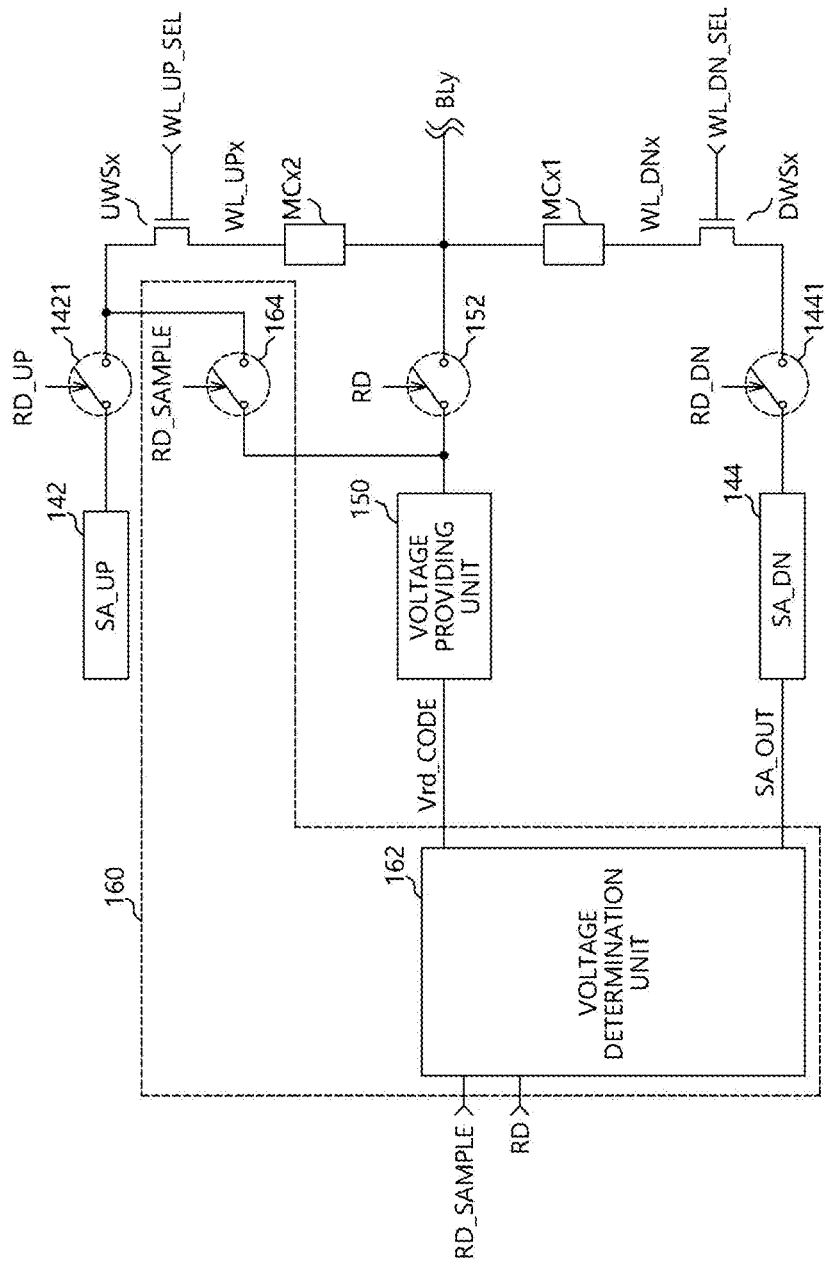
FIG. 4 is a configuration diagram illustrating a representation of an example a resistive memory apparatus including a voltage generating circuit according to an embodiment.

FIG. 4 is a configuration diagram illustrating a representation of an example a resistive memory apparatus including a voltage generating circuit according to an embodiment.

The pair of memory cells MCx1 and MCx2 may share the first signal line BLy and may be coupled between the pair of second signal lines WL_DNx and WL_UPx in series.

The plurality of second lower signal lines WL_DN0 to WL_DNn may be coupled to a lower sense amplifier (SA_DN) 144 through a second switching unit 1441. The plurality of second upper signal lines WL_UP0 to WL_UPn may be coupled to an upper sense amplifier (SA_UP) 142 through a first switching unit 1421. The second switching unit 1441 may be driven by a lower memory cell read signal RD_DN and the first switching unit 1421 may be driven by an upper memory cell read signal RD_UP.

Any one (i.e., WL_UPx) of the plurality of second upper signal lines WL_UP0 to WL_UPn may be selected by an upper signal line selection element UWSx driven by an upper signal line selection signal WL_UP_SEL. Any one (i.e., WL_DNx) of the plurality of second lower signal lines WL_DN0 to WL_DNn may be selected by a lower signal line selection element DWSx driven by a lower signal line selection signal WL_DN_SEL.

The first signal line BLy may be coupled to the voltage providing unit 150 through a third switching unit 152. The third switching unit 152 may be driven by a read signal RD.

The voltage generating circuit 160 according to an embodiment may include a voltage determination unit 162 and a path setup unit 164.

The voltage determination unit 162 may be configured to generate the read voltage code Vrd_CODE in response to a read voltage determination mode enable signal RD_SAMPLE and a sense signal SA_OUT which is an output signal of the lower sense amplifier 144.

The voltage providing unit 150 may be configured to generate the read voltage having a level corresponding to the read voltage code Vrd_CODE.

In the read voltage determination mode that the read voltage determination mode enable signal RD_SAMPLE is enabled, the upper memory cell read signal RD_UP and the read signal RD may be controlled to be disabled, and the lower memory cell read signal RD_DN may be controlled to be enabled. Accordingly, in the read voltage determination mode, the first switching unit 1421 and the third switching unit 152 may be controlled to have an off state and the second switching unit 1441 and the path setup unit 164 may be controlled to have an on state.

In this state, a voltage corresponding to the read voltage code Vrd_CODE determined in the voltage determination unit 162 may be applied to the second upper signal line WL_UPx. When the voltage level corresponding to the read voltage code Vrd_CODE does not reach a level which can switch both the first and second memory cells MCx1 and MCx2, the voltage determination unit 162 operating by the sense signal SA_OUT which is the output signal of the lower sense amplifier 144 may be configured to increase or reduce a level of the read voltage code Vrd_CODE. When both the first and second memory cells MCx1 and MCx2 are switched, the voltage determination unit 162 may terminate the operation of increasing or reducing the read voltage code Vrd_CODE and determine the read voltage code Vrd_CODE at this state as a final voltage code. That is, the read voltage corresponding to the read voltage code Vrd_CODE generated in the voltage determination unit 162 may be applied to the pair of memory cells in the read voltage determination mode. The voltage determination unit 162 may be configured to repeatedly perform a training cycle that the sense signal SA_OUT according to switching states of the pair of memory cells is provided from the lower sense amplifier. For example, the voltage determination unit 162 may be configured to terminate the training cycle when the level of the sense signal SA_OUT is transited to a preset level and to set the read voltage code Vrd_CODE at the termination timing of the training cycle as the final voltage code.

The voltage determination unit 162 may be configured to increase (or reduce) the read voltage code Vrd_CODE step by step every training cycle until the level of the sense signal SA_OUT is transited to the preset level.

The read signal RD may be enabled in the normal read mode, and the voltage providing unit 150 may receive the final voltage code predetermined in the voltage determination unit 162 as the read voltage code Vrd_CODE and provide the read voltage corresponding to the read voltage code Vrd_CODE to the first signal line BLy.

Figure 5:
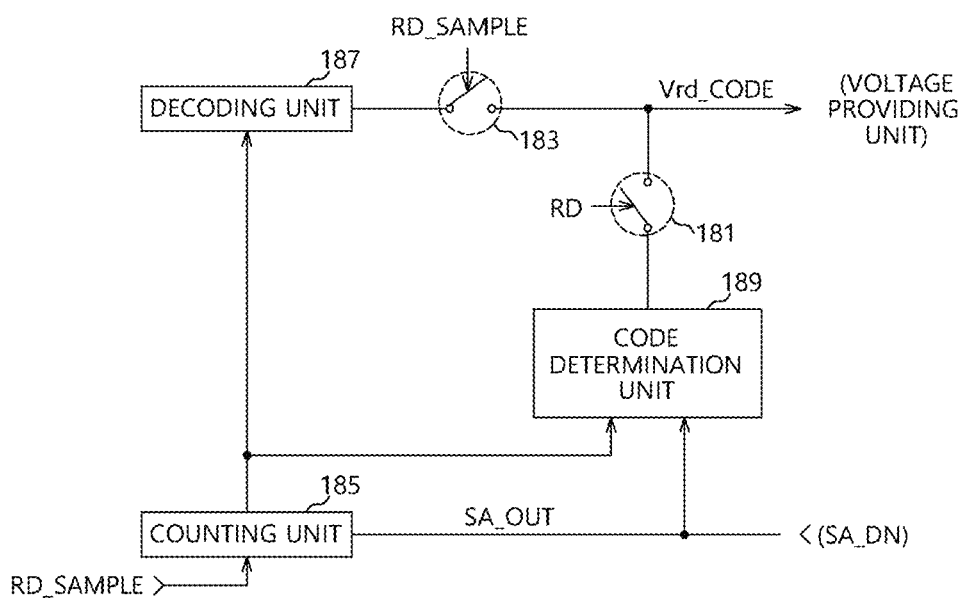
FIG. 5 is a configuration diagram illustrating a representation of an example a voltage determination unit according to an embodiment.

FIG. 5 is a configuration diagram illustrating a representation of an example a voltage determination unit according to an embodiment.

Referring to FIG. 5, the voltage determination unit 162 may be configured to include a first switching unit 181, a second switching unit 183, a counting unit 185, a decoding unit 187, and a code determination unit 189.

The first switching unit 181 may be coupled between an output terminal of the code determination unit 189 and the voltage providing unit 150 and may be configured to be driven in response to the read signal RD.

The second switching unit 183 may be coupled between an output terminal of the decoding unit 187 and the voltage providing unit 150 and may be configured to be driven in response to the read voltage determination mode enable signal RD_SAMPLE.

The counting unit 185 may be configured to be driven in response to the read voltage determination mode enable signal RD_SAMPLE and perform a counting operation based on the sense signal SA_OUT provided from the lower sense amplifier 144. In an embodiment, the counting unit 185 may be configured to perform the counting operation every training cycle until the sense signal SA_OUT is transited to the preset level.

The decoding unit 187 may be configured to convert a counting signal provided from the counting unit 185 to a digital code. The digital code converted in the decoding unit 187 may be provided to the voltage providing unit 150 as the read voltage code Vrd_CODE through the second switching unit 183.

The code determination unit 189 may be configured to generate the final voltage code from the counting signal at the timing that the counting unit 185 terminates the counting operation. The final voltage code generated in the code determination unit 189 may be provided as the read voltage code Vrd_CODE to the voltage providing unit 150 through the first switching unit 181 in the normal read mode.

In an embodiment, the read voltage corresponding to the read voltage code Vrd_CODE as the digital code output through the decoding unit 187 may be applied to the upper word line WL_UPx through the voltage providing unit 150. When the read voltage does not reach the level which can switch both the first and second memory cells MCx1 and MCx2, the sense signal SA_OUT may be output, for example, as a low level, and the counting unit 185 may perform the counting operation.

As the process is repeatedly performed at least once, the counting signal of the counting unit 185 may be increased (or reduced) step by step, and when the read voltage is increased to the level which can switch both the first and second memory cells MCx1 and MCx2, the level of the sense signal SA_OUT may be transited to, for example, a high level, and the counting unit 185 may terminate the counting operation.

When both the first and second memory cells MCx1 and MCx2 are switched, the read voltage may have the level corresponding to the voltage level (Vth_set+Vth_reset), and the code determination unit 189 may be configured to generate and store the final voltage code corresponding to a half ((Vth_set+Vth_reset)/2) of the read voltage level at the timing that the first and second memory cells MCx1 and MCx2 are switched. In an embodiment, the code determination unit 189 may generate and store the final voltage code by right-shifting the counting signal at the timing that the counting operation is terminated.

When the counting unit 185 terminates the counting operation, the read voltage determination mode may be terminated, and the final voltage code stored in the code determination unit 189 as the read voltage code Vrd_CODE may be provided to the voltage providing unit 150 in the normal read operation subsequent to the read voltage determination mode.

It has been described in FIG. 4 that the read voltage code is generated using a pair of memory cells as a reference cell, but this is not limited thereto.

The plurality of memory cells constituting the memory region 110 may have different resistance states, and the resistance states of the plurality of memory cell pairs may be determined to reflect the different resistance states.

Figure 6:
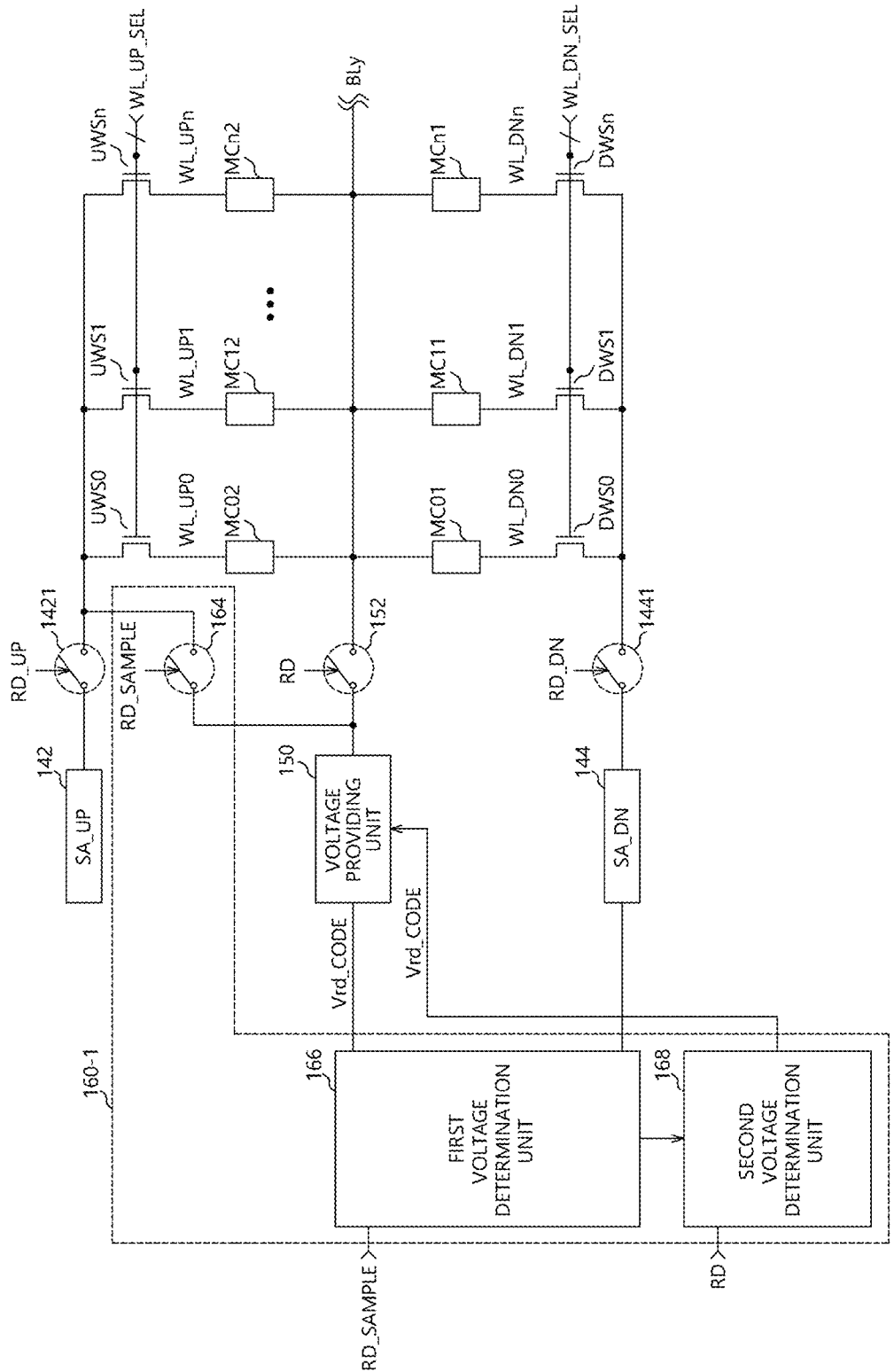
FIG. 6 is a configuration diagram illustrating a representation of an example a resistive memory apparatus including a voltage generating circuit according to an embodiment.

FIG. 6 is a configuration diagram illustrating a representation of an example a resistive memory apparatus including a voltage generating circuit according to an embodiment.

Referring to FIG. 6, a voltage generating circuit 160-1 according to an embodiment may include a path setup unit 164, a first voltage determination unit 166, and a second voltage determination unit 168. The voltage generating circuit 160-1 may have substantially the same configuration as a voltage generating circuit 160 relating to FIG. 4. Accordingly, duplicate descriptions of the voltage generating circuit 160-1 will be omitted hereinafter to avoid duplicate explanation.

In an embodiment, at least two or more memory cell pairs MC01 and MC02 to MCn1 and MCn2 which share a specific first signal line BLy in the memory region 110 may be used as a reference cell.

In the read voltage determination mode, the second upper signal line WL_UP0 to WL_UPn and the second lower signal line WL_DN0 to WL_DNn sharing the first signal line BLy with the second upper signal line WL_UP0 to WL_UPn may be selected by the upper signal line selection element UWS0 to UWSn and the lower signal line selection element DWS0 to DWSn and the read voltage may be applied through the selected second upper signal line WL_UP0 to WL_UPn.

As the second upper signal line WL_UP0 to WL_UPn and the second lower signal line WL_DN0 to WL_DNn sharing the first signal line BLy with the second upper signal line WL_UP0 to WL_UPn are selected one by one, the first voltage determination unit 166 may apply the read voltage to the selected second upper signal line in the read voltage determination mode, and generate the final voltage code according to the second signal line according to the switching states of the pair of memory cells coupled between the selected second upper signal line and the selected second lower signal line.

The second voltage determination unit 168 may be configured to receive the final voltage code according to the second signal line from the first voltage determination unit 166 and provide a determination code generated from a statistical value of the final voltage code as the read voltage code Vrd_CODE.

Figure 7:
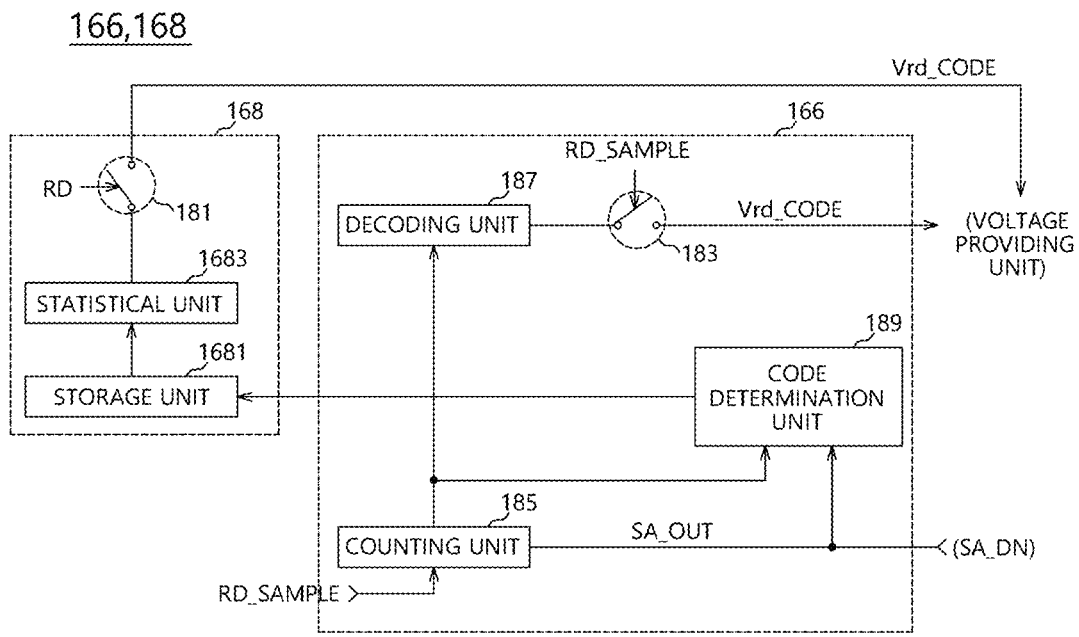
FIG. 7 is a configuration diagram illustrating a representation of an example a voltage determination unit according to an embodiment.

FIG. 7 is a configuration diagram illustrating a representation of an example a voltage determination unit according to an embodiment.

Referring to FIG. 7, the first voltage determination unit 166 is similar to the voltage determination unit 162 illustrated in FIG. 5, but the first voltage determination unit 166 may be different from the voltage determination unit 162 in that the final voltage code is determined according to the second signal line. The second voltage determination unit 168 may generate the read voltage code Vrd_CODE by receiving the final voltage code according to the second signal line from the first voltage determination unit 166 and calculating the statistical value of the final voltage code.

That is, the code determination unit 189 of the first voltage determination unit 166 may be configured to provide the final voltage code according to the second signal line to the second voltage determination unit 168.

The second voltage determination unit 168 may be configured to include a storage unit 1681 and a statistical unit 1683.

The storage unit 1681 may be configured to store the final voltage code according to the second signal line provided from the code determination unit 189.

The statistical unit 1683 may be configured to generate the determination code from the final voltage code according to the second signal line stored in the storage unit 1681. For example, the statistical unit 1683 may generate an average value of the final voltage code according to the second signal line as the determination code, and the determination code may be provided to the voltage providing unit 150 as the read voltage code Vrd_CODE in the normal read mode.

In an embodiment, the read voltage may be determined using a plurality of reference cell pairs. Accordingly, the different resistance distributions of the memory cells may be reflected, and thus the read voltage may be further accurately determined.

In an embodiment, the read voltage determination mode may be enabled every preset period. Accordingly, the read voltage may adaptively be varied with respect to change in a resistance state according to neighboring environments such as temperature, heat generated in a program operation, an elapsed time after the program, and thus the reliable operation may be guaranteed.

FIGS. 8 to 12 are configuration diagrams illustrating examples of a representation of an electronic apparatus according to various embodiments of the present technical spirit.

Figure 8:
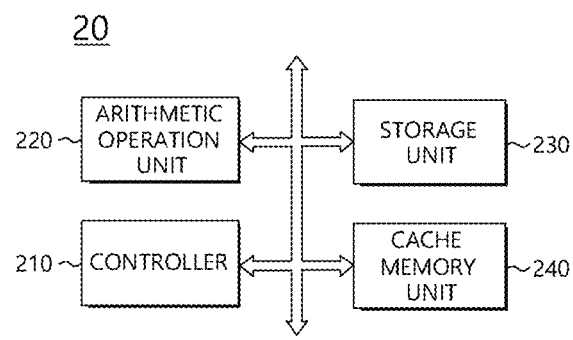
FIGS. 8 to 12 are configuration diagrams illustrating examples of a representation of an electronic apparatus according to various embodiments of the present technical spirit.

FIG. 8 is a configuration diagram illustrating an example of a representation of a processor according to an embodiment of the present technical spirit.

Referring to FIG. 8, a processor 20 may include a controller 210, an arithmetic operation unit 220, a storage unit 230, and a cache memory unit 240.

The controller 210 may control an overall operation of the processor 20 such as operations of decoding a command, performing input, output, or processing on data, and the like by receiving a signal such as the command or data from an external apparatus.

The arithmetic operation unit 220 may perform several arithmetic operations according to a decoding result of the command in the controller 210. The arithmetic operation unit 220 may include at least one arithmetic and logic unit (ALU).

The storage unit 230 may serve as a register, and may be configured to store data in the processor 20. The storage unit 230 may include a data register, an address register, a floating-point register, and other various registers. The storage unit 230 may store addresses in which data operated in the arithmetic operation unit 220, data according to an operation result, and data to be processed in the arithmetic operation unit 220 are stored.

The storage unit 230 may be, for example, a resistive memory apparatus illustrated in FIG. 1. Accordingly, the storage unit 230 may be configured to re-set a read voltage according to a preset period.

The cache memory unit 240 may serve as a temporary storage space.

The processor 20 illustrated in FIG. 8 may be a central processing unit (CPU) of an electronic apparatus, a graphic processing unit (GPU), a digital signal processor (DSP), an application processor (AP), and the like.

Figure 9:
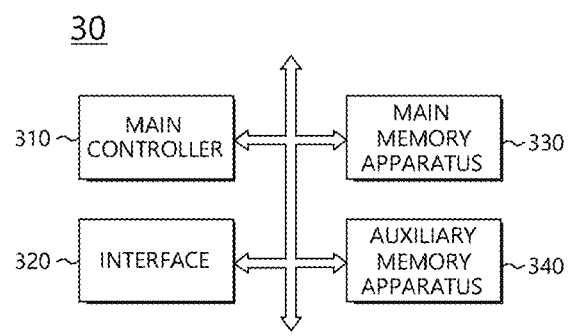
Figure 10:
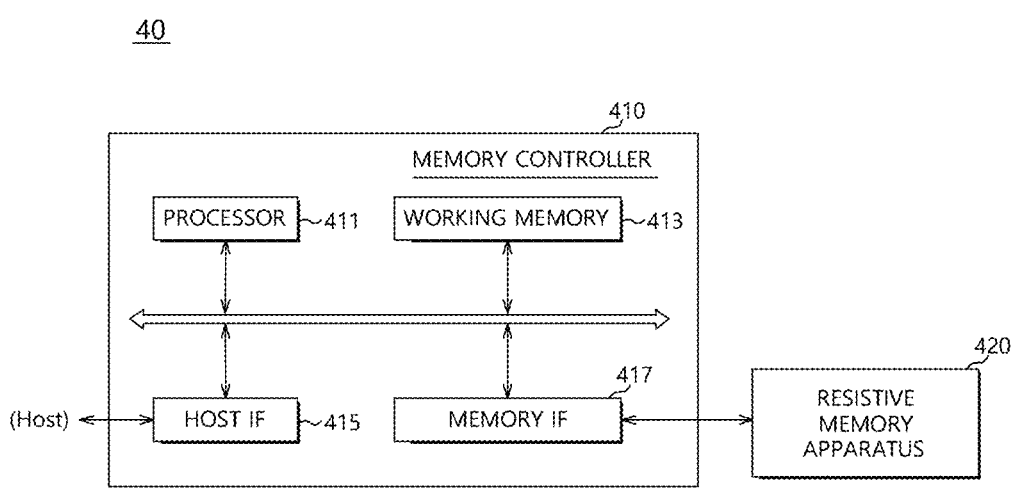

FIGS. 9 and 10 are configuration diagrams illustrating examples of a representation of a data processing system according to various embodiments of the present technical spirit.

A data processing system 30 illustrated in FIG. 9 may include a main controller 310, an interface 320, a main memory apparatus 330, and an auxiliary memory apparatus 340.

The data processing system 30 may perform input, processing, output, communication, storage, and the like to perform a series of operations for data processing, and may be an electronic apparatus such as a computer server, a personal portable terminal, a portable computer, a web tablet computer, a wireless terminal, a mobile communication terminal, a digital content player, a camera, a satellite navigation system, a video camera, a tape recorder, a telematics device, an audio/video (AV) system, or a smart television (TV), etc.

In an embodiment, the data processing system 30 may be a data storage apparatus. The data processing system 30 may be a disc type apparatus such as a hard disc, an optical drive, a solid state disc, or a digital versatile disc (DVD) or a card type apparatus such as a universal serial bus (USB) memory, a secure digital (SD) card, a memory stick, a smart media card, internal/external multimedia cards, or a compact flash card, etc.

The main controller 310 may exchange data with the main memory apparatus 330 through the interface 320, and the main controller 310 may perform an overall control such as decoding of commands input from an external apparatus through the interface 320 and an operation or comparison of data stored in the system.

The interface 320 may provide an environment that a command and data are exchangeable between an external apparatus and the data processing system 30. The interface 320 may be a man-machine interface apparatus which includes an input apparatus (for example, a keyboard, a keypad, a mouse, a voice recognition apparatus, and the like) and an output apparatus (for example, a display, a speaker, and the like) or a card interface apparatus or a disc interface apparatus (for example, Integrated Drive Electronics (IDE), Small Computer System Interface (SCSI), Serial Advanced Technology Attachment (SATA), External SATA (eSATA), Personal Computer Memory Card International Association (PCMCIA), and the like) according to an application environment of the data processing system 30.

The main memory apparatus 330 may store an application, a control signal, data, and the like required for an operation of the data processing system 30, and may serve as a storage space which may transfer and execute program or data from the auxiliary storage apparatus 340. The main memory apparatus 330 may be implemented using a memory apparatus having a nonvolatile characteristic. For example, the resistive memory apparatus illustrated in FIG. 1 may be used as the main memory apparatus 330.

The auxiliary memory apparatus 340 may be a space for storage of a program code, data, and the like, and may be a high-capacity memory apparatus. For example, the resistive memory apparatus illustrated in FIG. 1 may be used as the auxiliary memory apparatus 340.

That is, the main memory apparatus 330 and/or the auxiliary memory apparatus 340 may be configured to re-set a read voltage according to a preset period.

A data processing system 40 illustrated in FIG. 10 may include a memory controller 410 and a resistive memory apparatus 420.

The memory controller 410 may be configured to access the resistive memory apparatus 420 in response to a request from a host. The memory controller 410 may include a processor 411, a working memory 413, a host interface (IF) 415, and a memory interface (IF) 417.

The process 411 may be configured to control an overall operation of the memory controller 410. The working memory 413 may store an application, data, a control signal, and the like required for the operation of the memory controller 410.

The host interface 415 may perform protocol conversion for exchange of data and a control signal between the host and the memory controller 410, and the memory interface 417 may perform protocol conversion for exchange of data and a control signal between the memory controller 410 and the resistive memory apparatus 420.

For example, the resistive memory apparatus illustrated in FIG. 1 may be used as the resistive memory apparatus 420. The resistive memory apparatus 420 may be configured to re-set a read voltage according to a preset period.

The data processing system 40 illustrated in FIG. 10 may be used as a disc apparatus or internal/external memory cards of a portable electronic apparatus. The data processing system may be used as an image processor and other application chipsets.

The working memory 413 included in the memory controller 410 may also be implemented using the resistive memory apparatus illustrated in FIG. 1.

Figure 11:
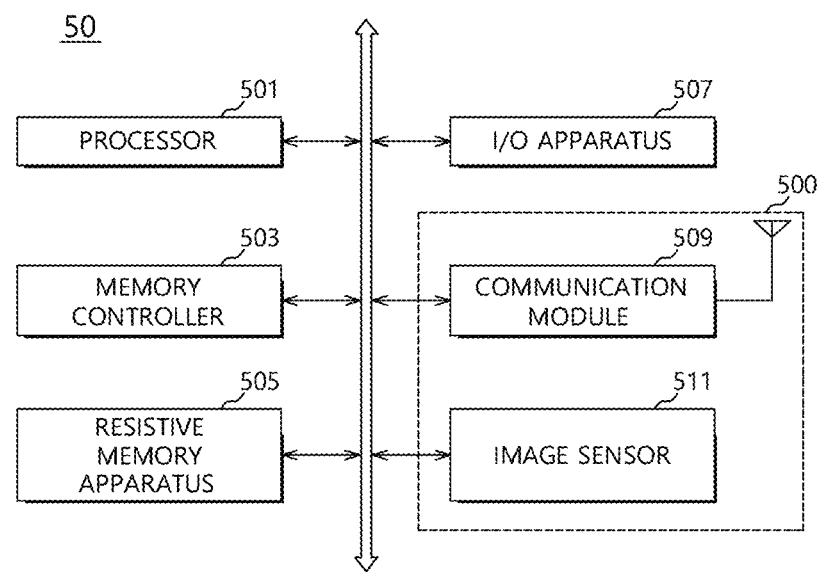
Figure 12:
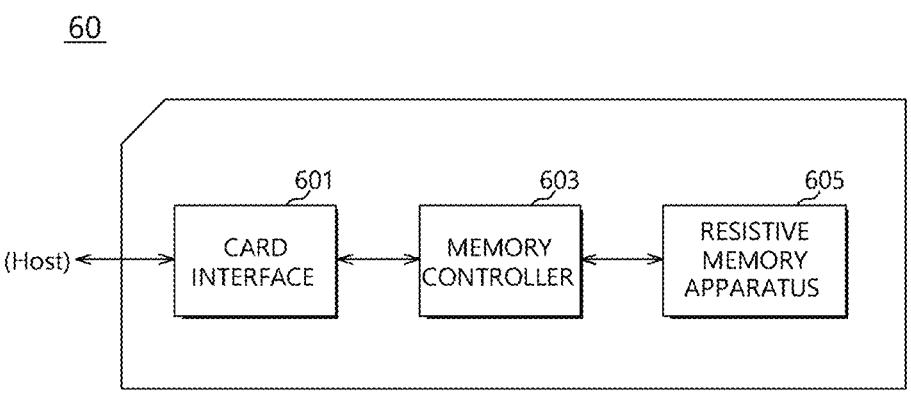

FIGS. 11 and 12 are configuration diagrams illustrating examples of a representation of an electronic system according to various embodiments of the present technical spirit.

An electronic system 50 illustrated in FIG. 11 may include a processor 501, a memory controller 503, a resistive memory apparatus 505, an input/output (I/O) apparatus 507, and a function module 500.

The memory controller 503 may control a data processing operation, for example, a write operation, a read operation, and the like of the resistive memory apparatus 505 according to control of the processor 501.

Data programmed in the resistive memory apparatus 505 may be output through the I/O apparatus 507 according to control of the processor 501 and the memory controller 503.

For example, the I/O apparatus 507 may include a display apparatus, a speaker apparatus, and the like.

The I/O apparatus 507 may also include an input apparatus, and the I/O apparatus 507 may input a control signal for controlling an operation of the processor 501 or data to be processed in the processor 501 through the input apparatus.

In an embodiment, the memory controller 503 may be implemented with a portion of the processor 501 or a separate chipset from the processor 501.

The resistive memory apparatus 505 may include, for example, a memory region configured of a resistive memory device, an address decoder, a controller, a voltage generator, and the like. In an embodiment, the resistive memory apparatus 505 may be the resistive memory apparatus illustrated in FIG. 1. The resistive memory apparatus 505 may be configured to re-set a read voltage according to a preset period.

The function module 500 may be a module which may perform a function selected according to an application example of the electronic system 50 illustrated in FIG. 11, and a communication module 509 and an image sensor 511 as an example of the function module 500 are illustrated in FIG. 11.

The communication module 509 may provide a communication environment that the electronic system 50 is coupled to a wired or wireless communication network to exchange data and a control signal.

The image sensor 511 may convert an optical image to digital image signals and transfer the digital image signals to the processor 501 and the memory controller 503.

When the function module 500 includes the communication module 509, the electronic system 50 of FIG. 11 may be a portable communication apparatus such as a wireless communication terminal. When the function module 500 may include the image sensor 511, the electronic system 50 may be a digital camera, a digital camcorder, or an electronic system (for example, a personal computer (PC), a laptop computer, a mobile communication terminal, and the like) to which any one of the digital camera and the digital camcorder is attached.

An electronic system 60 illustrated in FIG. 12 may include a card interface 601, a memory controller 603, and a resistive memory apparatus 605.

FIG. 12 is an illustrative diagram illustrating the electronic system 60 used as a memory card or a smart card, and the electronic system 60 illustrated in FIG. 12 may be any one among a PC card, a multimedia card, an embedded multimedia card, a secure digital card, and a universal serial bus (USB) drive, etc.

The card interface 601 may perform interacting on data exchange between a host and the memory controller 603 according to a protocol of the host. In an embodiment, the card interface 601 may refer to hardware which may support a protocol used in the host, software installed in the hardware which may support the protocol used in the host, or a signal transmission method.

The memory controller 603 may control data exchange between the resistive memory apparatus 605 and the card interface 601.

The resistive memory apparatus illustrated in FIG. 1 may be used as the resistive memory apparatus 605. The resistive memory apparatus 605 may be configured to re-set a read voltage according to a preset period The above embodiments are illustrative and not limitative. Various alternatives and equivalents are possible. The disclosure is not limited by the embodiments described herein. Nor are the embodiments limited to any specific type of semiconductor device. Other additions, subtractions, or modifications are obvious in view of the present disclosure and are intended to fall within the scope of the appended claims.

What is claimed is:

1. A resistive memory apparatus comprising:
   a memory region including a plurality of resistive memory cells arranged in a plurality of memory cell pairs, each of the plurality of the memory cell pairs sharing a first signal line and coupled between a pair of second signal lines in series;
   a voltage generating circuit configured to generate a read voltage code based on a switching state of at least one memory cell pair which stores complementary data in a read voltage determination mode; and
   a voltage providing unit configured to generate a read voltage corresponding to the read voltage code,
   wherein the voltage generating circuit is configured to apply the read voltage to any one of the pair of second signal lines in the read voltage determination mode and generate a final voltage code from the read voltage based on a timing that a current path is formed through the at least one memory cell pair.

2. The resistive memory apparatus of claim 1, wherein the plurality of the memory cell pairs each share a bit line and each are coupled between a lower word line and an upper word line in series.

3. The resistive memory apparatus of claim 1, wherein the voltage generating circuit is configured to apply the read voltage to any one pair of memory cell pairs by increasing or reducing the read voltage from an initial read voltage.

4. The resistive memory apparatus of claim 1, wherein the memory cell pair includes a first memory cell coupled between a lower signal line of the second signal lines and the first signal line and a second memory cell coupled between an upper signal line of the second signal lines and the first signal line, and
   the voltage generating circuit includes:
   a path setup unit coupled to an output terminal of the voltage providing unit and configured to apply the read voltage to the upper signal line in the read voltage determination mode; and
   a voltage determination unit configured to generate the read voltage code based on a level of a sense signal of the lower signal line.

5. The resistive memory apparatus of claim 4, wherein the voltage determination unit includes:
   a counting unit configured to perform a counting operation based on the sense signal and terminate the counting operation according to transition of the level of the sense signal;
   a decoding unit configured to generate the read voltage code from an output signal of the counting unit; and
   a code determination unit configured to generate a final voltage code by receiving the output signal of the counting unit based on a timing that the counting operation is terminated.

6. The resistive memory apparatus of claim 5, wherein the voltage determination unit further includes a switching unit configured to apply the read voltage code generated from the decoding unit to the upper signal line in the read voltage determination mode.

7. The resistive memory apparatus of claim 5, wherein the voltage determination unit further includes a switching unit configured to apply the final voltage code to the first signal line in a normal read mode.

8. The resistive memory apparatus of claim 5, wherein the code determination unit is configured to store the final voltage code corresponding to a half of the read voltage level based on the timing that the first and second memory cells are switched.

9. The resistive memory apparatus of claim 1, wherein the voltage generating circuit includes:
   a first voltage determination unit configured, when the plurality of memory cell pairs which share the first signal line are selected one by one and the read voltage is applied to any one of the second signal lines coupled to a selected memory cell pair in the read voltage determination mode, to generate a final voltage code according to the second signal lines from the read voltage based on a timing that a current path is formed through the selected memory cell pair; and
   a second voltage determination unit configured to generate a determination code based on the final voltage code according to the second signal lines and provide the determination code as the read voltage code in a normal read mode.

10. The resistive memory apparatus of claim 9, wherein the second voltage determination unit is configured to generate the determination code by averaging the final voltage code according to the second signal lines.

11. A voltage generating circuit for a resistive memory apparatus comprising:
    a voltage determination unit configured to generate a read voltage code based on switching states of at least a pair of memory cells which share a first signal line, are coupled between a pair of second signal lines in series, and store complementary data in a read voltage determination mode; and
    a path setup unit configured to apply a read voltage corresponding to the read voltage code to the second signal lines of the at least a pair of memory cells in the read voltage determination mode,
    wherein the path setup unit is configured to apply the read voltage to any one of the pair of second signal lines in the read voltage determination mode, and the voltage determination unit is configured to generate a final voltage code from the read voltage based on a timing that a current path is formed through the at least a pair of memory cells.

12. The voltage generating circuit of claim 11, wherein the plurality of the memory cell pairs each share a bit line and each are coupled between a lower word line and an upper word line in series.

13. The voltage generating circuit of claim 11, wherein the pair of memory cells include a first memory cell coupled between a lower signal line of the second signal lines and the first signal line and a second memory cell coupled between an upper signal line of the second signal lines and the first signal line,
    a path setup unit is configured to apply the read voltage to the upper signal line in the read voltage determination mode, and
    a voltage determination unit is configured to generate the read voltage code based on a level of a sense signal of the lower signal line.

14. The voltage generating circuit of claim 13, wherein the voltage determination unit includes:
    a counting unit configured to perform a counting operation based on the sense signal and terminate the counting operation according to transition of the level of the sense signal;

a decoding unit configured to generate the read voltage code from an output signal of the counting unit; and a code determination unit configured to generate a final voltage code by receiving the output signal of the counting unit based on a timing that the counting operation is terminated.

15. The voltage generating circuit of claim 14, wherein the voltage determination unit further includes a switching unit configured to apply the read voltage code generated from the decoding unit to the upper signal line in the read voltage determination mode.

16. The voltage generating circuit of claim 14, wherein the voltage determination unit further includes a switching unit configured to apply the final voltage code to the first signal line in a normal read mode.

17. The voltage generation circuit of claim 14, wherein the code determination unit is configured to store the final voltage code corresponding to a half of the read voltage level based on the timing that the first and second memory cells are switched.

18. The voltage generating circuit of claim 11, wherein the voltage determination unit includes:

a first voltage determination unit configured, when a plurality of memory cell pairs which share the first signal line are selected one by one and the read voltage is applied to any one of the second signal lines coupled to a selected memory cell pair in the read voltage determination mode, to generate a final voltage code according to the second signal lines from the read voltage based on a timing that a current path is formed through the selected memory cell pair; and a second voltage determination unit configured to generate a determination code based on the final voltage code according to the second signal lines and provide the determination code as the read voltage code in a normal read mode.

19. The voltage generating circuit of claim 18, wherein the second voltage determination unit is configured to generate the determination code by averaging the final voltage code according to the second signal lines.

20. A voltage generating circuit for a resistive memory apparatus comprising:

a voltage determination unit configured to generate a read voltage code based on switching states of at least a pair of memory cells which share a first signal line and store complementary data; and a path setup unit configured to apply a read voltage corresponding to the read voltage code to second signal lines of the at least a pair of memory cells, wherein the path setup unit is configured to apply the read voltage to any one of the pair of second signal lines in the read voltage determination mode, and the voltage determination unit is configured to generate a final voltage code from the read voltage based on a timing that a current path is formed through the at least a pair of memory cells.

* * * * *